United States Patent
Kawanaka et al.

(10) Patent No.: US 6,693,328 B1
(45) Date of Patent: Feb. 17, 2004

(54) SEMICONDUCTOR DEVICE FORMED IN A SEMICONDUCTOR LAYER PROVIDED ON AN INSULATING FILM

(75) Inventors: Shigeru Kawanaka, Yokohama (JP); Hideaki Nii, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/303,546

(22) Filed: Nov. 25, 2002

(30) Foreign Application Priority Data

Sep. 27, 2002 (JP) .......................... 2002-284331

(51) Int. Cl.$^7$ ............................................... H01L 27/12
(52) U.S. Cl. ........................ 257/347; 257/410; 257/411; 257/901
(58) Field of Search ................................ 257/347, 410, 257/411, 901

(56) References Cited

U.S. PATENT DOCUMENTS

| | | | |
|---|---|---|---|
| 5,973,364 A | 10/1999 | Kawanaka | 257/347 |
| 6,281,593 B1 * | 8/2001 | Brown et al. | 257/347 |
| 6,355,957 B1 * | 3/2002 | Maeda et al. | 257/347 |
| 6,403,405 B1 | 6/2002 | Kawanaka et al. | 257/347 |
| 6,429,487 B1 * | 8/2002 | Kunikiyo | 257/347 |
| 6,521,948 B2 * | 2/2003 | Ebina | 257/347 |
| 6,521,959 B2 * | 2/2003 | Kim et al. | 257/397 |
| 6,573,563 B2 * | 6/2003 | Lee et al. | 257/347 |
| 6,576,956 B2 | 6/2003 | Kawanaka | 257/347 |
| 2002/0050764 A1 | 5/2002 | Koga et al. | 310/309 |

FOREIGN PATENT DOCUMENTS

JP  61-34978  2/1986

OTHER PUBLICATIONS

Assaderaghi et al., "A Dynamic Threshold Voltage MOSFET (DTMOS) for Ultra–Low Voltage Operation," IEDM 1994 Technical Digest, pp. 809–812, Dec. 1994.

* cited by examiner

*Primary Examiner*—Gene M. Munson
(74) *Attorney, Agent, or Firm*—Frommer Lawrence & Haug LLP

(57) ABSTRACT

A semiconductor device includes an insulating film provided on a semiconductor substrate and a semiconductor layer provided on the insulating film. An element separating insulating film separates element area. A first gate insulating film is provided on the semiconductor layer in the element area. A gate electrode is provided on the first gate insulating film. Source/drain diffusion layers are formed in the semiconductor layer sandwiching a channel area under the gate electrode therebetween. A potential applying section inducing a leak current which controls the potential of the semiconductor layer comprises a second gate insulating film provided on the semiconductor layer in the element area and a conductive film provided on the second gate insulating film and connected to the gate electrode. The potential applying section is configured so that a leak current through the second gate insulating film is larger than a leak current through the first gate insulating film.

42 Claims, 5 Drawing Sheets

SEMICONDUCTOR DEVICE FORMED IN A SEMICONDUCTOR LAYER PROVIDED ON AN INSULATING FILM

BACKGROUND OF THE INVENTION

1. Field of the Invention

The present invention relates to a semiconductor device, and in particular, to a semiconductor device formed in a semiconductor layer provided on an insulating film.

2. Description of the Related Art

To reduce the power consumption and increase the density of semiconductor integrated circuits, it has been desired to reduce the size and operating voltage of individual elements constituting a semiconductor integrated circuit. In connection with such demands, SOI (Silicon On Insulator) elements are known which operate at a higher speed and with reduced power consumption.

FIGS. 10, 11A, and 11B schematically show a typical SOI element. As shown in FIGS. 10, 11A, and 11B, a semiconductor layer 53 mainly composed of silicon is provided on a semiconductor substrate 51 via an insulating film 52. An MIS (Metal Insulator Semiconductor) transistor Q is formed in an element area of the semiconductor layer 53 that is surrounded by an element separating insulating film 54.

An area (a body area) under a gate electrode G in the semiconductor layer 53 is connected to a contact 55.

The contact 55 is formed in a part of a contact area (contact area) extending over the gate electrode. Impurities of the same conductive type as that of the body area are introduced in the contact area. The potential of the body area is controlled by providing a potential to the contact 55.

The SOI element formed by aforementioned manner, however, needs an additional gate electrode area to form the body contact. Therefore an increase in a capacity existing in the area results in the decrease in the operation speed of the element.

To solve such a problem, the structure (a first conventional example) shown in FIG. 1 of Jpn. Pat. Appln. No. 6-105784 has hitherto been used. That is, this semiconductor device has element separating insulating films 4A and 4B with different thicknesses. An area 5B of a semiconductor layer 2 that is located under the thinner semiconductor separating insulating film 4A is connected to a contact used to control the potential of the body area.

The structure (a second conventional example) shown in Jpn. Pat. Appln. No. 10-242470 is also used. That is, this semiconductor device is connected to a contact 12 in a longitudinal direction of a gate electrode 9 using an area of an SOI active layer 3 that is located under an element separating insulating film 7.

In fabricating a semiconductor device according to the first conventional example, a part of the upper part of a polycrystal Sil2 is etched as shown in FIG. 2 of Prior Art Document 1. Then, an element separating insulating film 13 including the partly etched portion and the other portion having a film thickness different from that of the etched portion is formed, for example, by thermal oxidization. However, it is difficult in terms of controllability to remove only this part of the upper part of the semiconductor layer 2 or form the element separating insulating film 13 with different film thicknesses.

Further, in the second conventional example, an element separating insulating area 6 is formed between an element forming area 4 and a body contact area 5. Thus, this example creates problems such as an increase in area occupied by the element and a decrease in degree of freedom in arrangement of the element.

BRIEF SUMMARY OF THE INVENTION

According to a first aspect of the present invention, a semiconductor device is characterized by comprising a semiconductor substrate, an insulating film disposed on the semiconductor substrate, a semiconductor layer disposed on the insulating film, an element separating insulating film disposed in the semiconductor layer to form a separate element area, a first gate insulating film disposed on the semiconductor layer in the element area, a gate electrode disposed on the first gate insulating film, source/drain diffusion layers formed in the semiconductor layer so as to sandwich a channel area under the gate electrode therebetween, and a potential applying section to induce a leak current which controls the potential of the semiconductor layer, the potential applying section comprising a second gate insulating film disposed on the semiconductor layer in the element area and a conductive film disposed on the second gate insulating film and connected to the gate electrode, the potential applying section being configured so that a leak current flowing through the second gate insulating film is larger than a leak current flowing through the first gate insulating film.

DETAILED DESCRIPTION OF THE INVENTION

Figure 1:
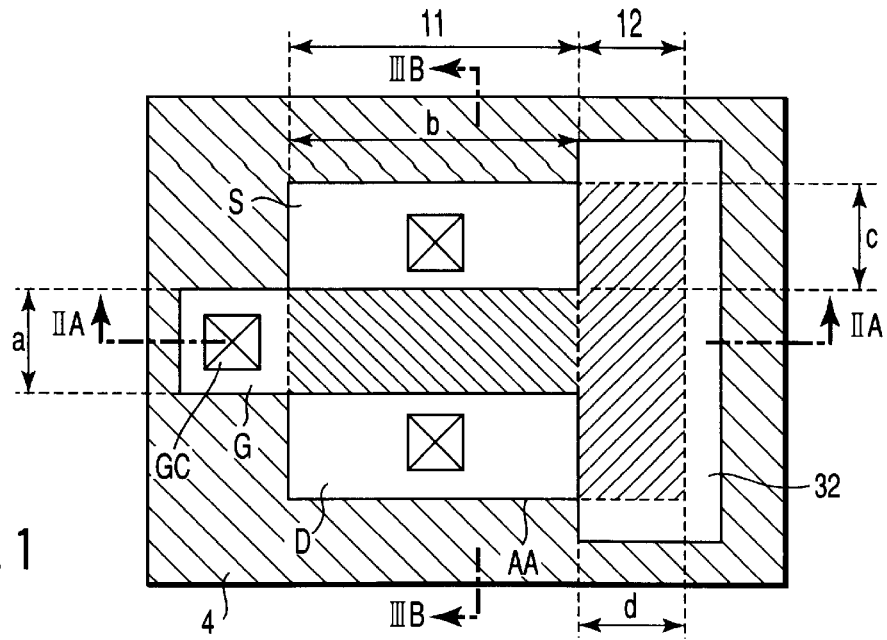
FIG. 1 is a plan view schematically showing a semiconductor device according to a first embodiment of the present invention.

Embodiments of the present invention will be described below with reference to the drawings. In the following description, those components that have substantially the same functions and configurations are denoted by the same reference numerals. Duplicate description will be given only when required.

(First Embodiment)

Figure 2A:
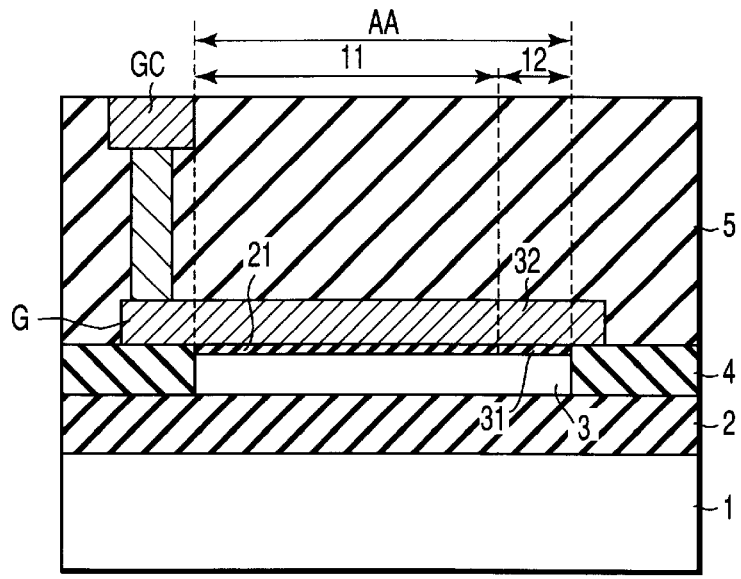
FIGS. 2A and 2B are sectional views schematically showing the semiconductor device shown in FIG. 1.
Figure 2B:
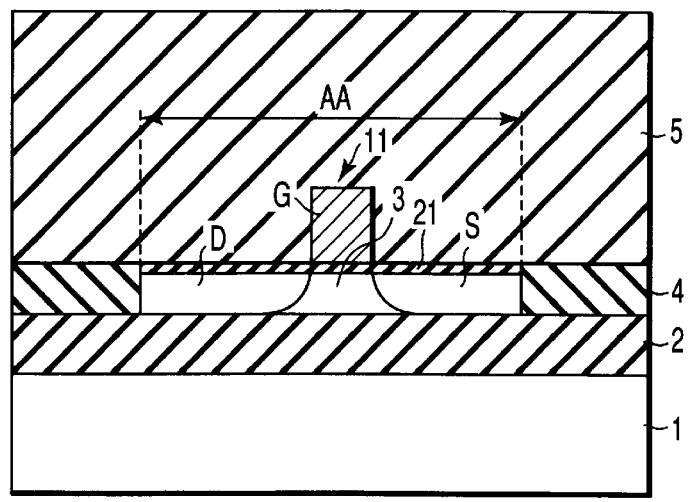

FIG. 1 is a plan view schematically showing a semiconductor device according to a first embodiment of the present invention. FIGS. 2A and 2B are sectional views schematically showing the structure of the semiconductor device along lines IIA—IIA and IIB—IIB in FIG. 1, respectively.

As shown in FIGS. 1, 2A, and 2B, an insulating film (buried oxide: BOX) composed of, for example, a silicon oxide film is provided on a semiconductor substrate 1. Preferably, the substrate is made from Al2O3 (Aluminum Oxide), Ge (Germanium), AlN (Aluminum Nitride) or Si (Silicon). Although, other suitable materials for the substrate will be apparent to one skilled in the art of the invention upon study of this disclosure. Further, it should be noted that the preferable substrate materials are the same for all of the embodiments of the invention.

In any event, a semiconductor layer 3 composed of, for example, silicon is provided on the insulating film 2. The semiconductor layer 3 has a thickness of, for example, about 150 nm. In the embodiment, a source diffusion layer S or a drain diffusion layer or a depletion layers extending from a source diffusion layer S or a drain diffusion layer D, all of which will be described later, reach the insulating film 2.

A semiconductor separating insulating film 4 formed by, for example, STI (Shallow Trench Isolation) is provided in the semiconductor layer 3. An element area AA surrounded by the element separating insulating film 4 is electrically separated from the other element areas (not shown). An MIS (Metal Insulator Semiconductor) transistor 11 and a potential applying section 12 are provided on the semiconductor layer 3 in the element area AA.

The transistor 11 is composed of a first gate insulating film 21, a source diffusion layer S, a drain diffusion layer D, and a gate electrode G. The gate electrode G is provided on the semiconductor layer 3 via a first gate insulating film 21 so as to extend in the lateral direction of FIG. 1 (a first direction). One end of the gate electrode G, for example, extends perpendicularly to the element separating insulating film 4 so as to form a contact GC. The source diffusion layer S and the drain diffusion layer D are provided so as to sandwich therebetween the lower part of the gate electrode G in the semiconductor area 3.

The potential applying section 12 is composed of a second gate insulating film 31 and a conductive film 32. The potential applying section 12 has a function of inducing a tunnel leak current that controls the potential of a body area of the transistor area 11. This tunnel leak current is adjusted by a method described later so as to control the potential of the body area of the transistor 11. The conductive film 32 is set to increase the channel length of the gate electrode G. Further, the conductive film 32 is provided with a function of simply inducing a tunnel leak current between the conductive film 32 and the underlying semiconductor layer 3 without substantially affecting the current driving force exerted by the transistor 11. Specifically, the conductive film 32 is arranged as follows:

That is, the conductive film 32 is provided on the semiconductor layer 3 via a second gate insulating film 31 so as to extend, for example, in the direction of the channel length of the transistor 11 (the vertical direction in FIG. 1). In this direction, the opposite ends of the conductive film 32 extend, for example, onto the element separating insulating film 4. Further, in the first direction, one end of the conductive film 32 extends, for example, onto the element separating insulating film 4. As a result, an end of the element area AA in which the conductive film 32 lies is entirely covered with the conductive film 32. In this area, the element area AA is not exposed.

The first insulating film 21 and second insulating film 31 are connected together. The gate electrode G and the conductive film 32 are connected together. As a result, the gate electrode G and the conductive film 32 form, for example, a T shape on a corresponding plane.

The first and second gate insulating films 21 and 31 are composed of substantially the same material. Further, the gate electrode G and the conductive film 32 are composed of substantially the same material.

The area of the part of the conductive film 32 that is located on the element area AA is at least equivalent to or larger than the area of the part of the gate electrode G that is located on the element area AA. That is, by way of example, for the size of the present element, the gate electrode has a width a of 0.05 $\mu$m. Further, the source diffusion layer S and the drain diffusion layer D each have a length b of 3 $\mu$m and a width c of 0.12 $\mu$m. Accordingly, a width d is properly selected so that (2×0.12 $\mu$m+0.05 $\mu$m)×d is equal to or larger than 0.05 $\mu$m×3 $\mu$m=0.15 $\mu$m².

According to the first embodiment, the semiconductor device has the potential applying section 12. The potential applying section 12 has the conductive film 32, positioned atop the second gate insulating film 31. The second gate insulating film 31 and the conductive film 32 are connected to the first gate insulating film 21 and the gate electrode G, respectively. The area of the part of the conductive film 32 that is located above the element area AA is at least equivalent to or larger than the area of the part of the gate electrode G that is located above the element area AA. Further, the thickness of the second gate insulating film is substantially equal to or less than the thickness of the first gate insulating film.

With the configuration described above, a tunnel leak current induced in the second gate insulating film 31 is larger than a tunnel leak current induced in the first gate insulating film 21. As a result, the tunnel leak current induced in the second gate insulating film 31 is dominant over the tunnel leak current induced in the first gate insulating film 21. Accordingly, first, when the transistor 11 is off (gate voltage $V_g=V_{SS}=0V$), body voltage is also 0V. On the other hand, when the transistor 11 is on (gate voltage $V_g=V_{CC}$=for example, 0.5V), the body voltage is also 0.5V owing to the tunnel leak current through the second gate insulating film 31. This enables the potential of the body area to be controlled, thereby preventing the potential of the body area from fluctuating while the element is operating.

Further, as described above, when the transistor 11 is off, the body voltage is also 0V. On the other hand, as the transistor 11 operates to increase gate voltage, the tunnel leak current through the second gate insulating film 31 increases. With an increase in tunnel leak current, the potential of the body area of the transistor 11 is biased to a positive side. Then, the threshold voltage of the transistor 11 increases, thereby providing a large on-current. This results in a larger ratio of the on-off of the drain current compared with conventional SOI elements with their body potential fixed and bulk type transistors.

Figure 3:
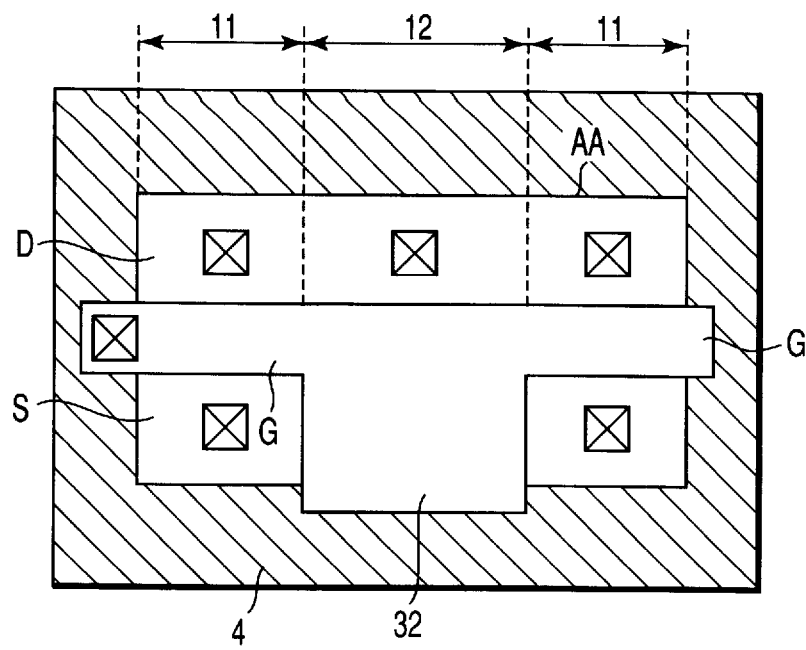
FIG. 3 is a plan view schematically showing a semiconductor device according to a variation of the first embodiment of the present invention.

Further, as described above, the area of the part of the conductive film 32 that is located on the element area AA has only to be at least equivalent to or larger than the area of the part of the gate electrode G that is located on the element area AA. Thus, for example, as shown in FIG. 3, the potential applying section 12 may be provided on either the source diffusion layer S or the drain diffusion layer D or between two gate electrodes G.

Furthermore, as described above, the minimum required area of the second gate insulating film 31 is equal to the area of the first gate insulating film 21. On the other hand, for the maximum area of the second gate insulating area 31, as this area increases, the aforementioned effects improve. However, with an excessively large area, the potential applying section 12 has a large parasitic capacity, thereby increasing delay time in the transistor 11. Thus, the maximum area of the second gate insulating film 31 is determined so as to limit the delay time involved in the operation of a circuit in which the semiconductor device according to the first embodiment is used, to within its allowable range, and so as to maintain the effects of the first embodiment.

(Second Embodiment)

In a second embodiment, the first and second gate insulating films 21 and 31 have different film thicknesses.

Figure 4:
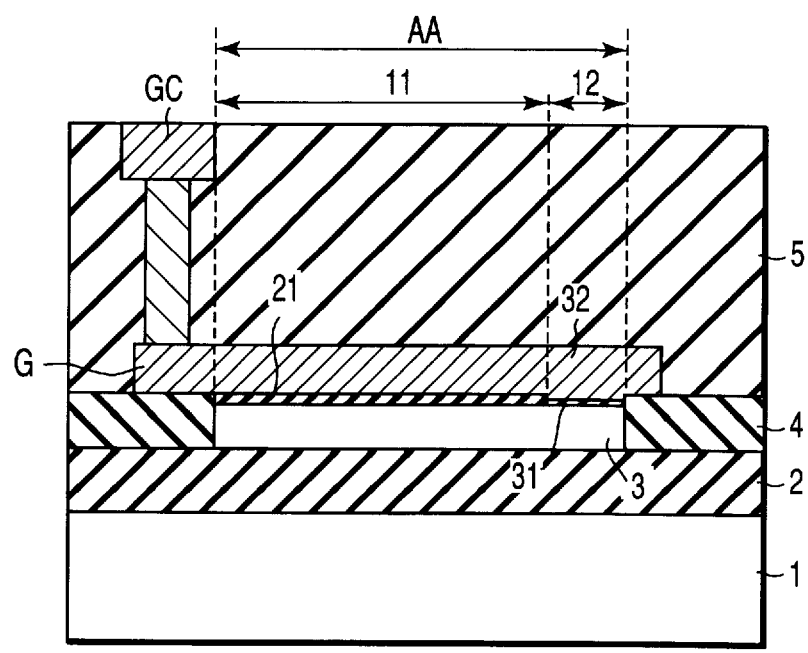
FIG. 4 is a sectional view schematically showing a semiconductor device according to a second embodiment of the present invention.

FIG. 4 is a sectional view schematically showing a semiconductor device according to the second embodiment of the present invention. A plan view of this semiconductor device is similar to that of the first embodiment. FIG. 4 schematically shows the structure of the semiconductor device along line IIA—IIA in FIG. 1.

As shown in FIG. 4, the first gate insulating film 21 and the second gate insulating film 31 have different film thicknesses. The first gate insulating film 21 has a film thickness of, for example, equal to or more than 5 nm. On the other hand, the second gate insulating film 31 has a smaller film thickness than the first gate insulating film 21. More specifically, the film thickness of the second gate insulating film 31 may be, for example, within the range of 3 nm to 0.5 nm and may be at least 2 nm to 4.5 nm smaller than that of the first gate insulating film 21. In a case of the first gate insulating film which is equal to or less than 3 nm, the second gate insulating film 31 may be at least 0.1 nm to 2 nm and preferably 0.2 nm smaller than that of the first gate insulating film 21.

Specifically, the first gate insulating film 21 preferably has a film thickness of 1.5 nm, and the second gate insulating film 31 preferably has a film thickness of 1.3 nm. Experiments demonstrate that these film thicknesses serve to sufficiently produce the effects of this embodiment, described later.

A method of fabricating the semiconductor device shown in FIG. 4 will be described below. FIGS. 5 to 9 sequentially show the steps of fabricating the semiconductor device shown in FIGS. 1 and 4, and schematically show a cross section taken along line IIA—IIA in FIG. 1.

Figure 5:
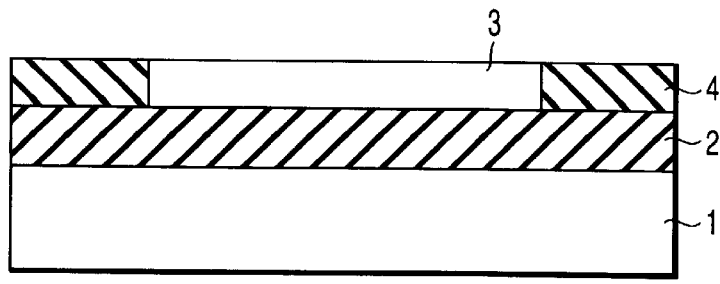
FIG. 5 is a sectional view schematically showing a step of fabricating the semiconductor device in FIG. 4.

As shown in FIG. 5, the insulating film 2 is formed on the semiconductor substrate 1, and then the semiconductor layer 3 is formed on the insulating film 2 by, for example, a SIMOX (Separation by Implantation of Oxygen) process or a bonding process. Then, the semiconductor layer 3 is thinned to a thickness of, for example, about 150 nm by a thermal oxidizing process and etching based on $NH_4F$. Then, the element separating insulating film 4 is formed by, for example, an STI process.

Next, impurities are introduced into the semiconductor area 3 in the element area AA by, for example, an ion injection process to adjust the threshold voltage of the transistor 11. Then, a material film for the first gate insulating film 21 having a film thickness of, for example, 1 nm is formed over the whole surface of the semiconductor layer 3 by, for example, thermal oxidization.

Figure 6:
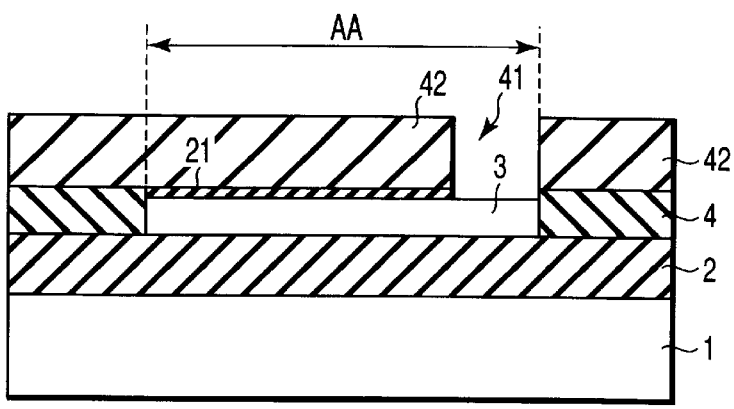
FIG. 6 is a sectional view schematically showing a step following the step shown in FIG. 5.

Then, as shown in FIG. 6, a resist film (a mask layer) 42 is formed over the whole surface of the semiconductor device so as to have an opening 41 formed at a position on the element area AA which corresponds to the gate insulating film 31 is to be formed. Then, the material film for the first gate insulating film 21 is partly removed by, for example, wet etching, using the resist film 42. As a result, the semiconductor layer 3 is exposed at its position corresponding to the opening, with the first gate insulating film 21 formed.

Figure 7:
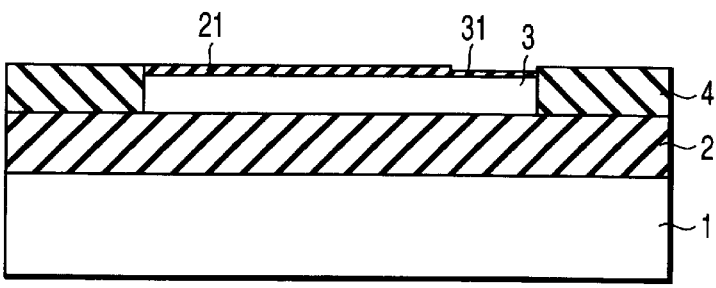
FIG. 7 is a sectional view schematically showing a step following the step shown in FIG. 6.

Next, as shown in FIG. 7, the resist film 42 is removed. Then, the semiconductor device is thermally treated to form the second gate insulating film 31. As a result, the second gate insulating film 31 is formed and the first gate insulating film 21 increases in its thickness.

Figure 8:
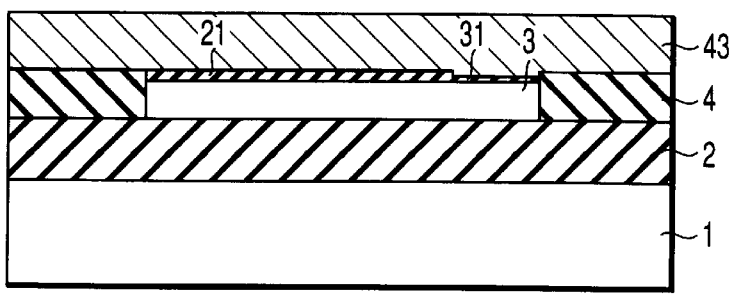
FIG. 8 is a sectional view schematically showing a step following the step shown in FIG. 7.

Next, as shown in FIG. 8, a material film 43 for the gate electrode G and conductive film 32, such as polycrystal silicon, is deposited over the whole surface of the semiconductor device by, for example, CVD (Chemical Vapor Deposition).

Figure 9:
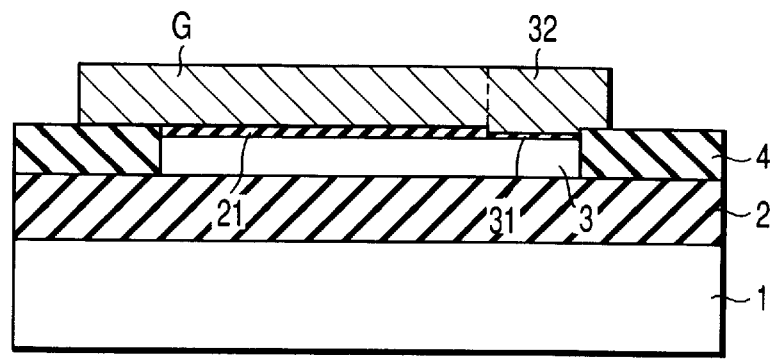
FIG. 9 is a sectional view schematically showing a step following the step shown in FIG. 8.

Then, as shown in FIG. 9, the material 43 is patterned by, for example, lithography and RIE (Reactive Ion Etching) processes so as to be shaped as shown in FIG. 1. As a result, the gate electrode G and the conductive film 32 are formed. Then, impurities are injected onto the whole surface of the semiconductor device by an ion injection process using the gate electrode G and the conductive film 32 as a mask. As a result, the source diffusion layer S and the drain diffusion layer D (neither of them are shown) are formed. Then, thermal treatment based on, for example, an RTA (Rapid Thermal Annealing) process is carried out in order to activate the impurities. Then, low-resistance material such as a silicide can be formed as required Next, as shown in FIG. 4, an interlayer insulating film 5 is formed over the whole surface of the semiconductor device. Then, a contact and a wire for the gate electrode G and contacts and wires (not shown) for the source and drain diffusion layers S, D are formed so as to penetrate the interlayer insulating film 5. Subsequently, a further interlayer insulating film and a multilayer wiring layer are formed as required.

According to the second embodiment, the second gate insulating film 31 has a smaller thickness than the first gate insulating film 21. Thus, the tunnel leak current through the second gate insulating film 31 increases and thus becomes dominant over the tunnel leak current through the first gate insulating film 21. Consequently, effects similar to those of the first embodiment are produced.

(Third Embodiment)

According to a third embodiment, the first and second gate insulating films 21 and 31 are composed of different materials.

Figure 10:
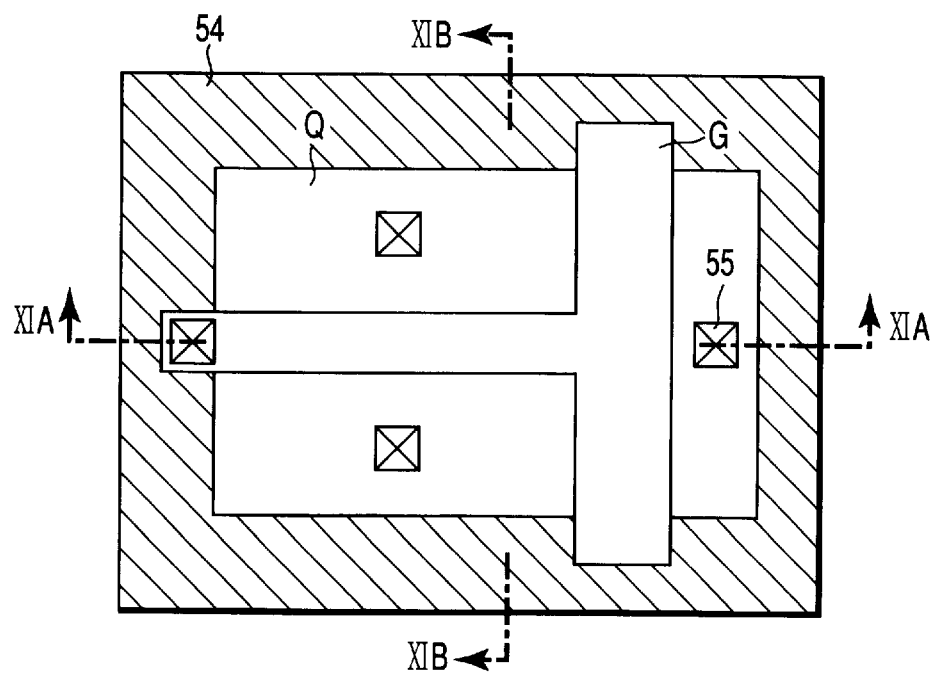
FIG. 10 is a plan view schematically showing a typical semiconductor device.
Figure 11A:
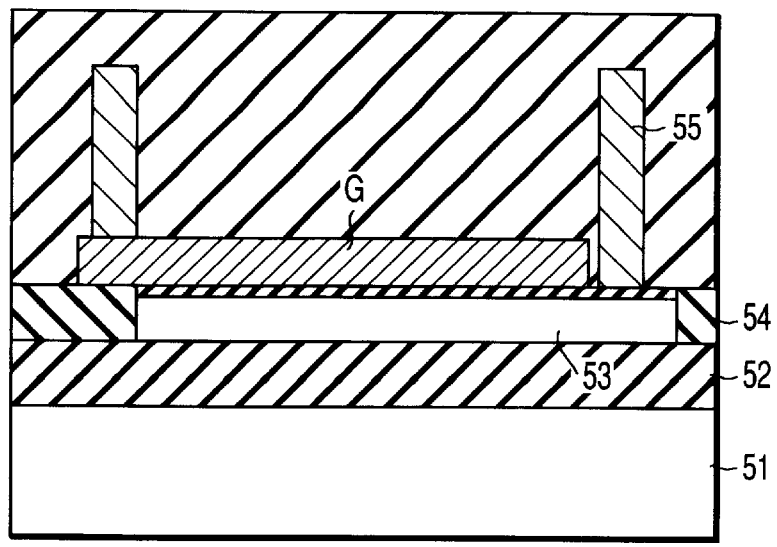
FIGS. 11A and 11B are sectional views schematically showing the semiconductor device in FIG. 10.
Figure 11B:
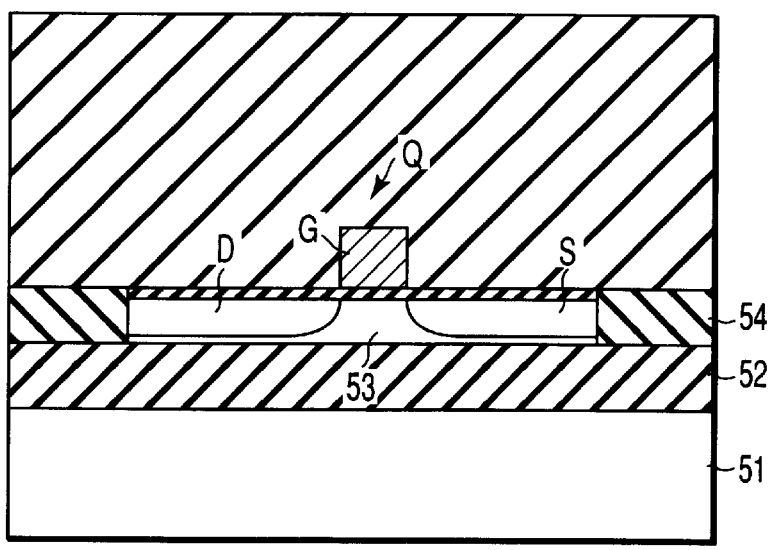

The plan and sectional views of a semiconductor device according to the third embodiment are similar to those of a typical SOI shown in FIGS. 10, 11A, and 11B, or that of the first embodiment.

In the third embodiment, the first insulating film 21 is composed of a material different from that of the second gate insulating film 31. More specifically, the first gate insulating material 21 is made of a material that is higher in a dielectric constant and smaller in the leak current than the second gate insulating film 31. Specifically, the first gate insulating film 21 is composed of a material such as SiON, SiN, $Al_2O_3$, $HfO_2$, $ZrO_2$, $La_2O_3$, or $TiO_2$. On the other hand, the second gate insulating film 31 is composed of, for example, $SiO_2$ or SiON. The other parts are similar to those of the first and second embodiments.

According to the third embodiment, the first gate insulating film 21 is composed of a material that is higher in a dielectric constant and smaller in the tunnel leak current than the second gate insulating film 31. Thus, the thickness of the first gate insulating film can be thicker than that of the second gate insulating film. Therefore, the tunnel leak current through the second gate insulating film can be increased while that of the first gate insulating film remains to be small. Consequently, effects similar to those of the first embodiment are produced.

Any of the illustrated materials for the gate insulating films may be added to a material commonly used.

(Fourth Embodiment)

According to a fourth embodiment, the first and second gate insulating films 21 and 31 contain impurities of different densities.

The plan and sectional views of a semiconductor device according to the fourth embodiment are similar to those of a common SOI shown in FIGS. 10, 11A, and 11B, or that of the first embodiment.

The first and second gate insulating films 21 and 31 are both substantially composed of a silicon oxide film. The first gate insulating film 21 has a higher nitrogen density than the second gate insulating film 31. The nitrogen density of the first gate insulating film 21 may be, for example, tenfold higher that that of the second gate insulating film 21.

Specifically, the first gate insulating film 21 may have a nitrogen density of, for example, $1 \times 10^{18}$ cm$^{-3}$. The second insulating film 31 may have a nitrogen density of, for example, $1 \times 10^{17}$ cm$^{-3}$.

Such a configuration is realized by injecting nitrogen only into the second gate insulating film 31 using, for example, an ion injection process after the first and second gate insulating films are nitrided. Alternatively, nitrogen may be injected into the first gate insulating film 21, with a larger amount of nitrogen injected into the second gate insulating film 31. The other parts are similar to those of the first and second embodiments.

According to the fourth embodiment, the first gate insulating film 21 has a higher nitrogen density than the second gate insulating film 31. Thus, the tunnel leak current through the second gate insulating film 31 increases and thus becomes dominant over the tunnel leak current through the first gate insulating film 21. Consequently, effects similar to those of the first embodiment are produced.

(Fifth Embodiment)

A fifth embodiment is additionally used with any of the first to fourth embodiments.

Normally, in executing a step of injecting ions to form source and drain diffusion layers, the same ions are injected into the gate electrode, making it conductive, in order to reduce the number of fabrication steps. Thus, if a p-type semiconductor layer is used, all of the source and drain diffusion layers and the gate electrode must be of an n type.

On the other hand, in the fifth embodiment, a step of making the conductive film 32 conductive is separated from a step of forming the source and drain diffusion layers S and D. In this case, the conductive film 32 has such ions injected thereinto so as to make the conductive film 32 of the same conductive type as that of the semiconductor layer 3 (the body area of the transistor 11). As a result, the potential applying section 12 induces a larger gate leak current. Consequently, combining such a structure with any of the first to fourth embodiments enhances the effects of that embodiment.

In view of the characteristics of the circuit using the SOI element to which the present invention is applied, or the like, any of the above embodiments may be combined together so that the tunnel leak current through the second gate insulating film 31 is optimum. That is, if, for example, the first embodiment does not allow the potential applying section 12 to induce a sufficient tunnel leak current, the structure of any of the second to fourth embodiments may be added to the first embodiment. As a result, an SOI element can be realized which does not affect the delay time involved in the operation of the circuit.

Further, the above embodiments have been described in conjunction with, for example, the SOI element. However, for example, an SOS (Silicon On Sapphire) element may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an insulating film provided on the semiconductor substrate;
   a semiconductor layer provided on the insulating film;
   an element separating insulating film provided in the semiconductor layer to separate an element area;
   a first gate insulating film provided on the semiconductor layer in the element area;
   a gate electrode provided on the first gate insulating film;
   source/drain diffusion layers formed in the semiconductor layer so as to sandwich a channel area under the gate electrode therebetween; and
   a potential applying section inducing a leak current, the leak current controlling the potential of the semiconductor layer, the potential applying section comprising a second gate insulating film provided on the semiconductor layer in the element area and a conductive film provided on the second gate insulating film and connected to the gate electrode, the potential applying section configured so that a leak current flowing through the second gate insulating film is larger than a leak current flowing through the first gate insulating film.

2. A semiconductor device according to claim 1, wherein the area of the part of the potential applying section that is located above the element area is equal to or larger than the area of the part of the gate electrode that is located above the element area.

3. A semiconductor device according to claim 1, wherein the second gate insulating film has a smaller film thickness than the first gate insulating film.

4. A semiconductor device according to claim 1, wherein the first and second gate insulating films are substantially composed of a silicon oxide film containing nitrogen, and the first gate insulating film has a higher nitrogen density than that of the second gate insulating film.

5. A semiconductor device according to claim 1, wherein the first gate insulating film is substantially composed of a material having a larger dielectric constant than that of the second gate insulating film.

6. A semiconductor device according to claim 1, wherein the conductive film is of the same conductive type as that of the semiconductor layer.

7. A semiconductor device according to claim 1, wherein the semiconductor layer has a thickness so that the layer selected from the group consisting of the drain diffusion layer, the source diffusion layer, a depletion layer extending from the source diffusion layer, and a depletion layer extending from the drain diffusion layer reaches the insulating film.

8. A semiconductor device comprising:

a semiconductor substrate;

an insulating film provided on the semiconductor substrate;

a semiconductor layer provided on the insulating film;

an element separating insulating film provided in the semiconductor layer to separate an element area;

a first gate insulating film provided on the semiconductor layer in the element area;

a gate electrode provided on the first gate insulating film;

source/drain diffusion layers formed in the semiconductor layer so as to sandwich a channel area under the gate electrode therebetween; and a potential applying section inducing a leak current, the leak current controlling the potential of the semiconductor layer, the potential applying section comprising a second gate insulating film provided on the semiconductor layer in the element area and a conductive film provided on the second gate insulating film and connected to the gate electrode, the area of the part of the potential applying section that is located above the element area being equal to or larger than the area of the part of the gate electrode that is located above the element area.

9. A semiconductor device according to claim 8, wherein the first and second gate insulating films are substantially composed of a silicon oxide film containing nitrogen, and the first gate insulating film has a higher nitrogen density than that of the second gate insulating film.

10. A semiconductor device according to claim 8, wherein the first gate insulating film is substantially composed of a material having a larger dielectric constant than that of the second gate insulating film.

11. A semiconductor device according to claim 8, wherein the conductive film is of the same conductive type as that of the semiconductor layer.

12. A semiconductor device according to claim 8, wherein the semiconductor layer has a thickness so that the layer selected from the group consisting of the drain diffusion layer, the source diffusion layer, a depletion layer extending from the source diffusion layer, and a depletion layer extending from the drain diffusion layer reaches the insulating film.

13. A semiconductor device comprising:

a semiconductor substrate;

an insulating film provided on the semiconductor substrate;

a semiconductor layer provided on the insulating film;

an element separating insulating film provided in the semiconductor layer to separate element area;

a first gate insulating film provided on the semiconductor layer in the element area;

a gate electrode provided on the first gate insulating film;

source/drain diffusion layers formed in the semiconductor layer so as to sandwich a channel area under the gate electrode therebetween; and a potential applying section inducing a leak current, the leak current controlling the potential of the semiconductor layer, the potential applying section comprising a second gate insulating film provided on the semiconductor layer in the element area and having a larger film thickness than the first gate insulating film and a conductive film provided on the second gate insulating film and connected to the gate electrode.

14. A semiconductor device according to claim 13, wherein the first and second gate insulating films are substantially composed of a silicon oxide film containing nitrogen, and the first gate insulating film has a higher nitrogen density than that of the second gate insulating film.

15. A semiconductor device according to claim 13, wherein the first gate insulating film is substantially composed of a material having a larger dielectric constant than that of the second gate insulating film.

16. A semiconductor device according to claim 13, wherein the conductive film is of the same conductive type as that of the semiconductor layer.

17. A semiconductor device according to claim 13, wherein the semiconductor layer has a thickness so that the layer selected from the group consisting of the drain diffusion layer, the source diffusion layer, a depletion layer extending from the source diffusion layer, and a depletion layer extending from the drain diffusion layer reaches the insulating film.

18. A semiconductor device comprising:

a substrate;

an insulating film provided on the substrate;

a semiconductor layer provided on the insulating film;

a first gate insulating film provided on the semiconductor layer in an element area;

a gate electrode provided on the first gate insulating film;

at least one diffusion layer formed in the semiconductor layer and including at least two areas so as to sandwich a channel area under the gate electrode therebetween; and a potential applying section operable to induce a leak current, the leak current controlling the potential of the semiconductor layer, the potential applying section comprising a second gate insulating film provided on the semiconductor layer in the element area and a conductive film provided on the second gate insulating film and connected to the gate electrode, the potential applying section configured so that a leak current flowing through the second gate insulating film is larger than a leak current flowing through the first gate insulating film.

19. A semiconductor device according to claim 18, further comprising an element separating insulating film provided in the semiconductor layer to separate an element area.

20. A semiconductor device according to claim 18, wherein the area of the part of the potential applying section that is located above the element area is equal to or larger than the area of the part of the gate electrode that is located above the element area.

21. A semiconductor device according to claim 18, wherein the second gate insulating film has a smaller film thickness than the first gate insulating film.

22. A semiconductor device according to claim 18, wherein the first and second gate insulating films are substantially composed of a silicon oxide film containing nitrogen, and the first gate insulating film has a higher nitrogen density than that of the second gate insulating film.

23. A semiconductor device according to claim 18, wherein the first gate insulating film is substantially composed of a material having a larger dielectric constant than that of the second gate insulating film.

24. A semiconductor device according to claim 18, wherein the conductive film is of the same conductive type as that of the semiconductor layer.

25. A semiconductor device according to claim 18, wherein the semiconductor layer has a thickness so that a layer selected from the group consisting of a drain diffusion layer, a source diffusion layer, a depletion layer extending from the source diffusion layer, and a depletion layer extending from the drain diffusion layer reaches the insulating film.

26. A semiconductor device according to claim 18, wherein said substrate is made from at least one material selected from the group consisting of Aluminum Oxide, Germanium, Aluminum Nitride and Silicon.

27. A semiconductor device comprising:
a substrate;
an insulating film provided on the substrate;
a semiconductor layer provided on the insulating film;
a first gate insulating film provided on the semiconductor layer in an element area;
a gate electrode provided on the first gate insulating film;
at least one diffusion layer formed in the semiconductor layer and including at least two areas so as to sandwich a channel area under the gate electrode therebetween; and
a potential applying section inducing a leak current, the leak current controlling the potential of the semiconductor layer, the potential applying section comprising a second gate insulating film provided on the semiconductor layer in the element area and a conductive film provided on the second gate insulating film and connected to the gate electrode, the area of the part of the potential applying section that is located above the element area being equal to or larger than the area of the part of the gate electrode that is located above the element area.

28. A semiconductor device according to claim 27, further comprising an element separating insulating film provided in the semiconductor layer to separate an element area.

29. A semiconductor device according to claim 27, wherein the second gate insulating film has a smaller film thickness than the first gate insulating film.

30. A semiconductor device according to claim 27, wherein the first and second gate insulating films are substantially composed of a silicon oxide film containing nitrogen, and the first gate insulating film has a higher nitrogen density than that of the second gate insulating film.

31. A semiconductor device according to claim 27, wherein the first gate insulating film is substantially composed of a material having a larger dielectric constant than that of the second gate insulating film.

32. A semiconductor device according to claim 27, wherein the conductive film is of the same conductive type as that of the semiconductor layer.

33. A semiconductor device according to claim 27, wherein the semiconductor layer has a thickness so that a layer selected from the group consisting of a drain diffusion layer, a source diffusion layer, a depletion layer extending from the source diffusion layer, and a depletion layer extending from the drain diffusion layer reaches the insulating film.

34. A semiconductor device according to claim 27, wherein said substrate is made from at least one material selected from the group consisting of Aluminum Oxide, Germanium, Aluminum Nitride and Silicon.

35. A semiconductor device comprising:
a substrate;
an insulating film provided on the substrate;
a semiconductor layer provided on the insulating film;
a first gate insulating film provided on the semiconductor layer in an element area;
a gate electrode provided on the first gate insulating film;
at least one diffusion layer formed in the semiconductor layer and including at least two areas so as to sandwich a channel area under the gate electrode therebetween; and
a potential applying section inducing a leak current, the leak current controlling the potential of the semiconductor layer, the potential applying section comprising a second gate insulating film provided on the semiconductor layer in the element area and having a larger film thickness than the first gate insulating film and a conductive film provided on the second gate insulating film and connected to the gate electrode.

36. A semiconductor device according to claim 35, further comprising an element separating insulating film provided in the semiconductor layer to separate an element area.

37. A semiconductor device according to claim 35, wherein the area of the part of the potential applying section that is located above the element area is equal to or larger than the area of the part of the gate electrode that is located above the element area.

38. A semiconductor device according to claim 35, wherein the first and second gate insulating films are substantially composed of a silicon oxide film containing nitrogen, and the first gate insulating film has a higher nitrogen density than that of the second gate insulating film.

39. A semiconductor device according to claim 35, wherein the first gate insulating film is substantially composed of a material having a larger dielectric constant than that of the second gate insulating film.

40. A semiconductor device according to claim 35, wherein the conductive film is of the same conductive type as that of the semiconductor layer.

41. A semiconductor device according to claim 35, wherein the semiconductor layer has a thickness so that a layer selected from the group consisting of a drain diffusion layer, a source diffusion layer, a depletion layer extending from the source diffusion layer, and a depletion layer extending from the drain diffusion layer reaches that insulating film.

42. A semiconductor device according to claim 35, wherein said substrate is made from at least one material selected from the group consisting Aluminum Oxide, Germanium, Aluminum Nitride and Silicon.

* * * * *